United States Patent
da Silva, Jr. et al.

(10) Patent No.: US 9,356,590 B1
(45) Date of Patent: May 31, 2016

(54) PRODUCTION TEST TRIMMING ACCELERATION

(71) Applicant: Freescale Semiconductor, Inc., Austin, TX (US)

(72) Inventors: Edevaldo Pereira da Silva, Jr., Campinas (BR); Joe Chayachinda, Austin, TX (US); Ricardo P. Coimbra, Campinas (BR); Marcelo de Paula Campos, Jaguariuna (BR)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 14/571,596

(22) Filed: Dec. 16, 2014

(51) Int. Cl.
*H03K 5/22* (2006.01)
*G01R 19/165* (2006.01)

(52) U.S. Cl.
CPC ............ *H03K 5/22* (2013.01); *G01R 19/16566* (2013.01)

(58) Field of Classification Search
None
See application file for complete search history.

(56) References Cited

U.S. PATENT DOCUMENTS

| | | | |
|---|---|---|---|
| 5,440,305 A | 8/1995 | Signore et al. | |
| 6,338,032 B1 | 1/2002 | Chen | |
| 6,504,394 B2 | 1/2003 | Ohlhoff | |
| 7,359,255 B2 | 4/2008 | Kimura et al. | |
| 7,423,445 B2 | 9/2008 | Lewison et al. | |
| 7,579,903 B2 * | 8/2009 | Oku | G11C 5/147 327/538 |
| 8,143,953 B2 | 3/2012 | von Staudt et al. | |
| 8,929,158 B1 * | 1/2015 | Wang | G11C 5/147 365/185.24 |
| 2002/0027454 A1 * | 3/2002 | MacGugan | H03M 1/60 327/101 |
| 2007/0047334 A1 | 3/2007 | Lee | |
| 2008/0122495 A1 | 5/2008 | Boerstler et al. | |
| 2009/0002029 A1 | 1/2009 | Kim | |
| 2010/0289590 A1 | 11/2010 | von Staudt et al. | |

* cited by examiner

*Primary Examiner* — Long Nguyen

(57) ABSTRACT

Systems and methods for production test trimming acceleration. In an illustrative, non-limiting embodiment, a method may include providing a first trim code to a reference circuit, where the reference circuit is configured to output a first signal in response to the first trim code; integrating a difference between the first signal and a target voltage value into a first integrated value; providing a second trim code to the reference circuit, where the reference circuit is configured to output a second signal in response to the second trim code; integrating a difference between the second signal and the target voltage value into a second integrated value; and adjusting at least one of the first or second trim codes in response to a comparison between the first and second integrated values.

21 Claims, 4 Drawing Sheets

PRODUCTION TEST TRIMMING ACCELERATION

FIELD

This disclosure relates generally to electronic devices, and more specifically, to systems and methods for production test trimming acceleration.

BACKGROUND

Complementary Metal-Oxide Semiconductor (CMOS) technology is commonly used to manufacture integrated circuits (ICs). Examples of modern ICs include microprocessors, microcontrollers, memories, voltage regulators, analog-to-digital and digital-to-analog converters, etc. Generally speaking, one or more components within an IC may operate based upon a voltage reference. To provide such a voltage reference, a voltage reference circuit may be designed within the IC.

An example of a voltage reference circuit is the bandgap circuit. A bandgap circuit is configured to output a temperature independent voltage reference with a value of approximately 1.25 V, or another value suitably close to the theoretical 1.22 eV bandgap of silicon at 0 K—that is, the energy required to promote an electron from its valence band to its conduction band to become a mobile charge.

In bandgap circuits, it is often necessary to tune the circuit to obtain highly accurate reference voltages. This tuning may be accomplished, for example, by trimming a resistor ratio or other voltage divider circuit into smaller steps.

The inventors hereof have recognized that in certain industries (e.g., automotive, etc.) tighter specifications have driven the need for higher accuracy voltage regulation. Several electronic parts now require fine trimming of bandgap circuits, which can take a relative long time during production. For instance, a bandgap circuit having 5 or 6-bit level and/or temperature slope calibration calibration may ordinarily require 1024 to 4096 voltage measurements (e.g., when trimming at two temperatures or more) to seek and find a suitable trimming code.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments disclosed herein are directed to systems and methods for production test trimming acceleration. In some implementations, a production test trimming acceleration circuit, as described herein, may avoid the need for performing a large number of high-accuracy measurements with a tester and Device-Under-Test (DUT) interaction, for example, in order to calibrate a voltage reference. Such a voltage reference may be provided, for instance, by a bandgap reference voltage circuit.

In some cases, based at least in part upon an externally provided voltage reference, a test trimming acceleration circuit may search for suitable trimming combinations. The search algorithm and architecture may provide better noise rejection than a naive binary search, and it may be able to quickly identify optimum or suitable trim codes. Accordingly, in various implementations, some of the systems and methods described herein may be particularly applicable to the production testing of highly accurate electronic circuits.

Moreover, the systems and methods described herein provide test trim acceleration, reducing test cost while featuring increased noise immunity, particularly when compared to conventional solutions. In various implementations, a production test trimming acceleration circuit, as described herein, consumes minimum area and, because as it may sometimes be used only as part of production test but not necessary during field use or normal operation, the circuit may be disposed on areas of the chip (e.g., a microcontroller, etc.) that would be not used otherwise (e.g., under a bus, etc.). As such, these systems and methods may provide significant test cost reduction and potentially higher trimming accuracy.

In many implementations, these systems and methods may be incorporated into a wide range of electronic devices including, for example, computer systems or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, etc. More generally, the systems and methods discussed herein may be incorporated into any device or system having one or more electronic parts or components.

Figure 1:
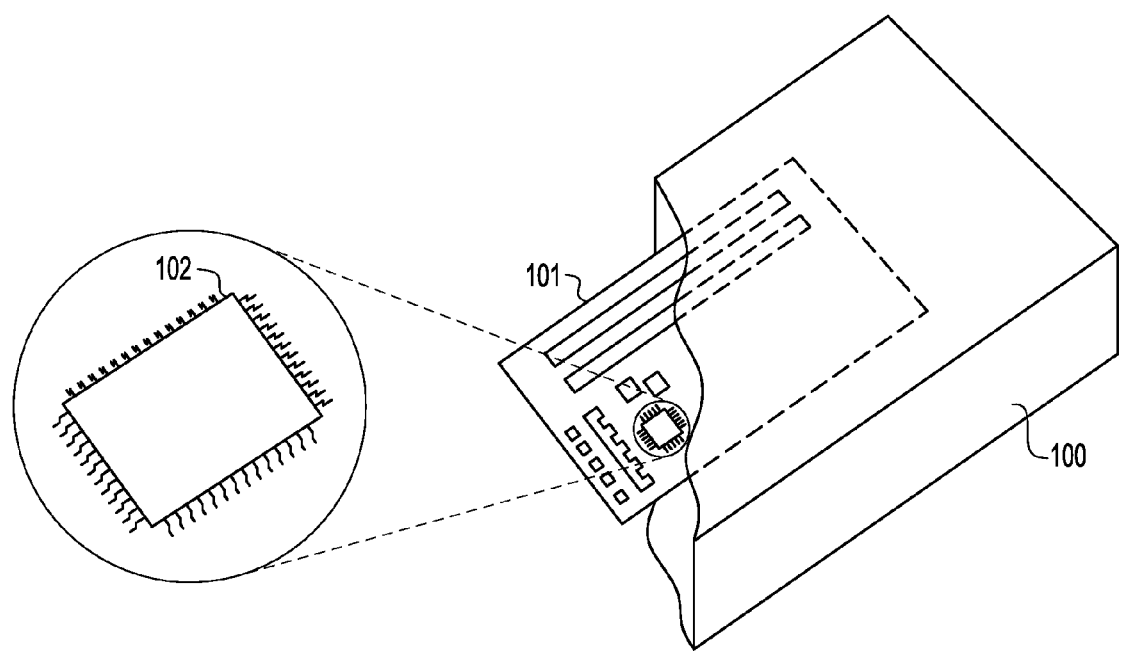
FIG. 1 is a diagram of an example of an electronic device including one or more integrated circuits according to some embodiments.

Turning to FIG. 1, a block diagram of electronic device 100 is depicted. In some embodiments, electronic device 100 may be any of the aforementioned electronic devices, or any other electronic device. As illustrated, electronic device 100 includes one or more Printed Circuit Boards (PCBs) 101, and at least one of PCBs 101 includes one or more electronic chip(s) or integrated circuit(s) 102. In some implementations, integrated circuit(s) 102 may implement one or more of the systems and methods described in more detail below.

Examples of integrated circuit(s) 102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), or the like. Additionally or alternatively, integrated circuit(s) 102 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), etc. Additionally or alternatively, integrated circuit(s) 102 may include one or more mixed-signal or analog circuits, such as, for example, Analog-to-Digital Converter (ADCs), Digitalto-Analog Converter (DACs), Phased Locked Loop (PLLs), oscillators, filters, amplifiers, transformers, etc. Additionally or alternatively, integrated circuit(s) 102 may include one or more Micro-ElectroMechanical Systems (MEMS), Nano-ElectroMechanical Systems (NEMS), or the like.

As such, integrated circuit(s) 102 may include a number of different portions, areas, or regions. These various portions may include one or more processing cores, cache memories, internal bus(es), timing units, controllers, analog sections, mechanical elements, etc. Thus, in various embodiments, integrated circuit(s) 102 may include a bandgap circuit and a trimming circuit configured to set or control an output voltage—that is, a bandgap voltage—provided by the bandgap circuit. During the production test of integrated circuit(s) 102, the trimming circuit may be adjusted using the various systems and methods for trimming acceleration described herein.

Integrated circuit(s) 102 may be disposed within an electronic component package configured to be mounted onto PCB 101 using any suitable packaging technology such as, for example, Ball Grid Array (BGA) packaging or the like. In some applications, PCB 101 may be mechanically mounted within or fastened onto electronic device 100. It should be noted that, in certain implementations, PCB 101 may take a variety of forms and/or may include a plurality of other elements or components in addition to integrated circuit(s) 102.

Figure 2:
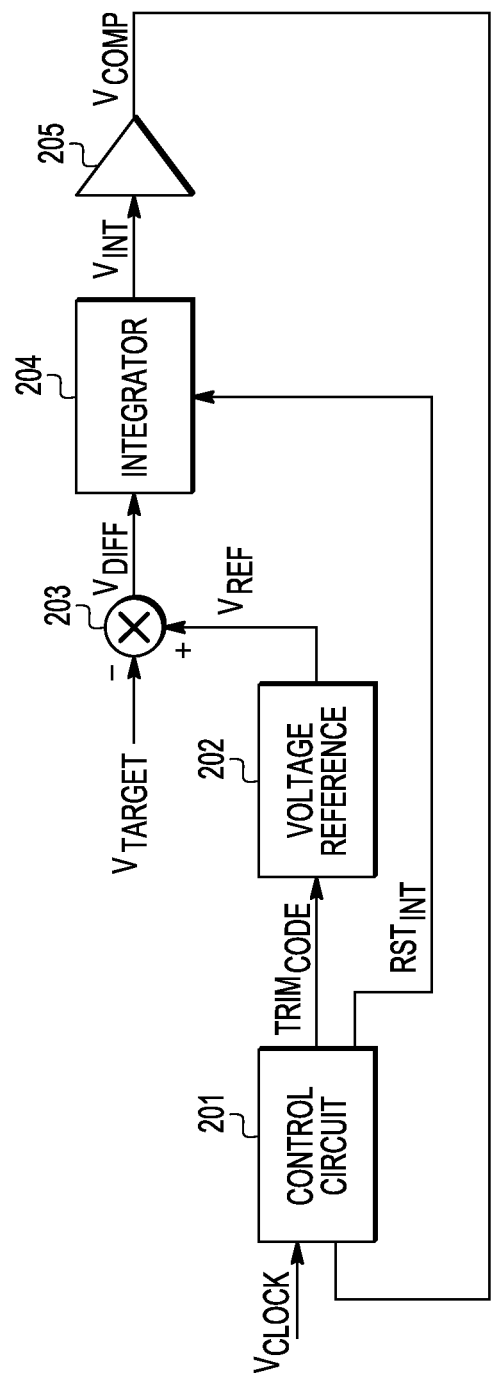
FIG. 2 is a block diagram of an example of a production test trimming acceleration circuit according to some embodiments.

FIG. 2 is a block diagram of an example of production test trimming acceleration circuit 200 according to some embodiments. As shown, control circuit (e.g., a logic circuit) 201 receives a clock signal ($V_{Clock}$) and outputs a trim code ($TRIM_{Code}$) and a reset signal ($RST_{Int}$). In some cases, control circuit 201 may be implemented as part of integrated circuit(s) 102 discussed in FIG. 1, and it may operate according to the method described in FIG. 3 below.

Voltage reference circuit 202 may include a bandgap reference circuit or the like, and it is configured to output a regulated, reference voltage ($V_{Ref}$). The value of $V_{Ref}$ may be trimmed, calibrated, adjusted, or otherwise modified internally by reference circuit 202 as a function of $TRIM_{Code}$, for example, using any suitable methods known to a person of ordinary skill in the art.

Summer or adder circuit 203 may receive a target voltage value ($V_{Target}$), for example, from a tester or chip on test board, may receive $V_{Ref}$ from voltage reference circuit 203, and may provide a differential voltage ($V_{Diff}$) equal to $V_{Ref}$ minus $V_{Target}$. It should be noted, however, that in other embodiments, adder circuit 203 may be a subtractor circuit. Moreover, the polarities of the inputs of component 203 may be switched such that $V_{Diff}=V_{Target}-V_{Ref}$. Integrator circuit 204 receives $V_{Diff}$, performs an integration operation, which resettable under control of control circuit 201 via $RST_{Int}$, and produces an integrated signal ($V_{Int}$). Comparator circuit 205 is configured to perform one or more comparison operations upon $V_{Int}$, and outputs the result of those comparisons as a comparison signal ($V_{Comp}$) to control circuit 201.

It should be noted that, in some implementations, $V_{Diff}$ may be other than a differential voltage. More generally, $V_{Diff}$ may be a single-ended or a differential voltage. Particularly, as a person of ordinary skill in the art will recognize in light of this disclosure, $V_{Diff}$ may be single-ended in a given embodiment but may have more stringent accuracy and/or noise requirements a differential implementation in another embodiment.

Figure 3:
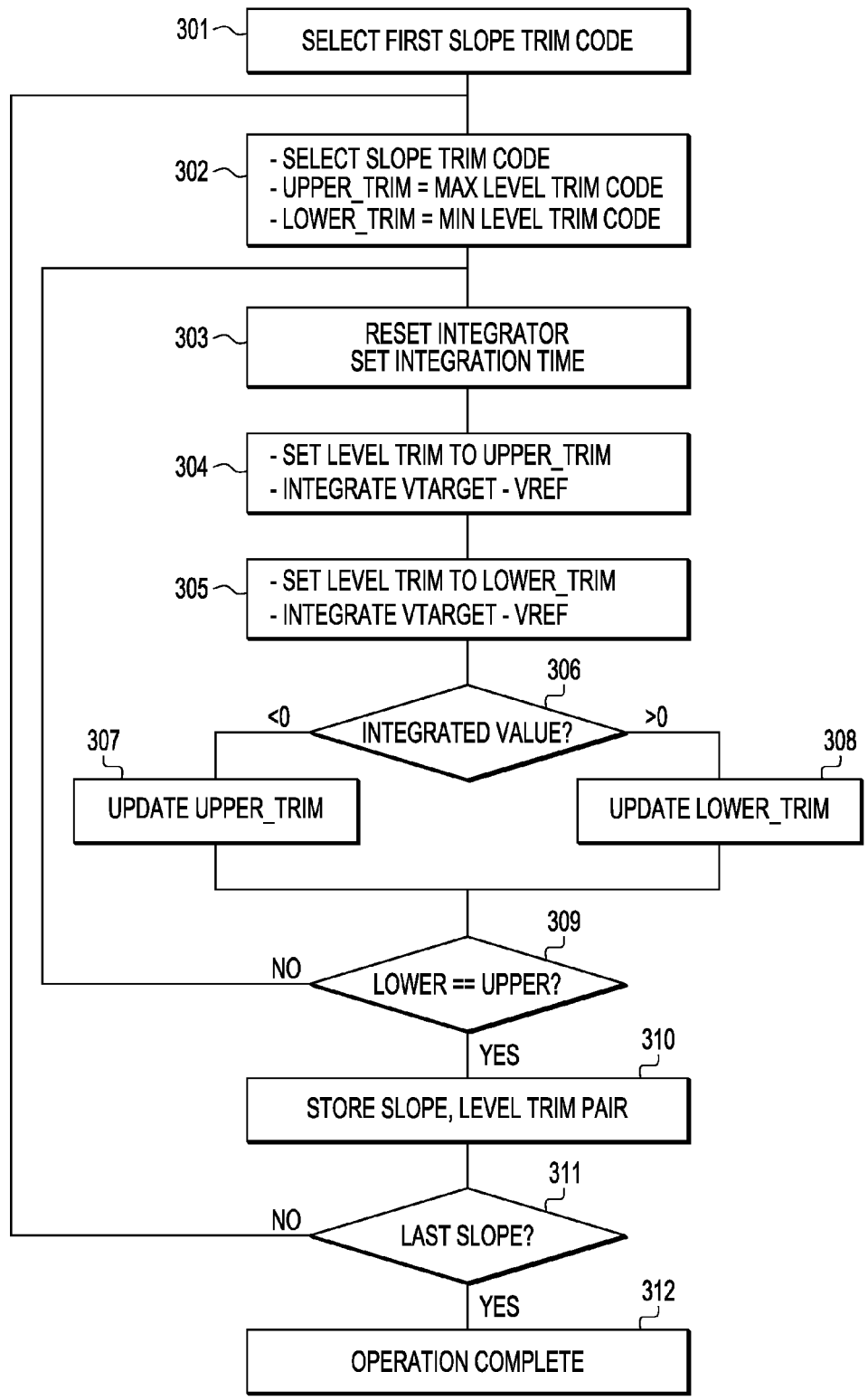
FIG. 3 is a flowchart of an example of a method for production test trimming acceleration according to some embodiments.

FIG. 3 is a flowchart of an example of method 300 for production test trimming acceleration, suitable for both slope and level calibration. In some embodiments, method 300 may be performed, at least in part, by production test trimming acceleration circuit 200 under control of control circuit 201.

Particularly, at block 301, control circuit 201 may select a first slope trim code, and at block 302 control circuit 201 may set that code. It may also set a first (e.g., upper) trim code corresponding to a maximum $V_{Ref}$ voltage level and a second (e.g., lower) trim code corresponding to a minimum $V_{Ref}$ voltage level.

At block 303, control circuit 201 may reset integrator 204 and may set or select an integration time or interval. At block 304, control circuit 201 may set the level trim provided to voltage reference circuit 202 to the upper trim value, and integrator 204 may integrate the difference between $V_{Target}$ and $V_{Ref}$ (the maximum voltage level) into a first integrated value. Then, after the integration time or period, at block 305 control circuit 201 may set the level trim provided to voltage reference circuit 202 to the lower trim value, and integrator 204 may integrate the difference between $V_{Target}$ and $V_{Ref}$ (now the minimum voltage level) into a second integrated value.

At block 306, comparator 205 and/or control circuit 201 may determine whether the total integrated value accumulated during the preceding two integration periods is greater or smaller than a selected reference value (e.g., zero); that is, whether the first integrated value is greater than the second integrated value or vice-versa. If the first integrated value is greater than the second integrated value, the upper trim code may be updated to cause voltage reference circuit 202 to produce a smaller $V_{Ref}$ at block 307. Conversely, if the second integrated value is greater than the first integrated value, the lower trim code may be updated to cause voltage reference circuit 202 to produce a larger $V_{Ref}$ at block 308.

Again, the comparison performed by comparator 205 uses a selected reference value. In a differential implementation, the selected reference value may be zero. Conversely, in a single-ended implementation, the selected reference value may be the voltage reference $V_{Ref}$ itself.

At block 309, control circuit 201 may determine whether the upper trim code is equal to the lower trim code. If not, control returns to block 303 and operations 303-308 may be performed again with an updated upper and/or lower trim code. Otherwise, at block 310, control circuit may store the resulting level trim associated with the current slope. At block 311, method 300 determines whether the current slope is also the last slope. If so, the operation is complete at block 312. Otherwise, control returns to block 302 so that the same level trim searching procedure may be performed for a subsequent slope.

Figure 4:
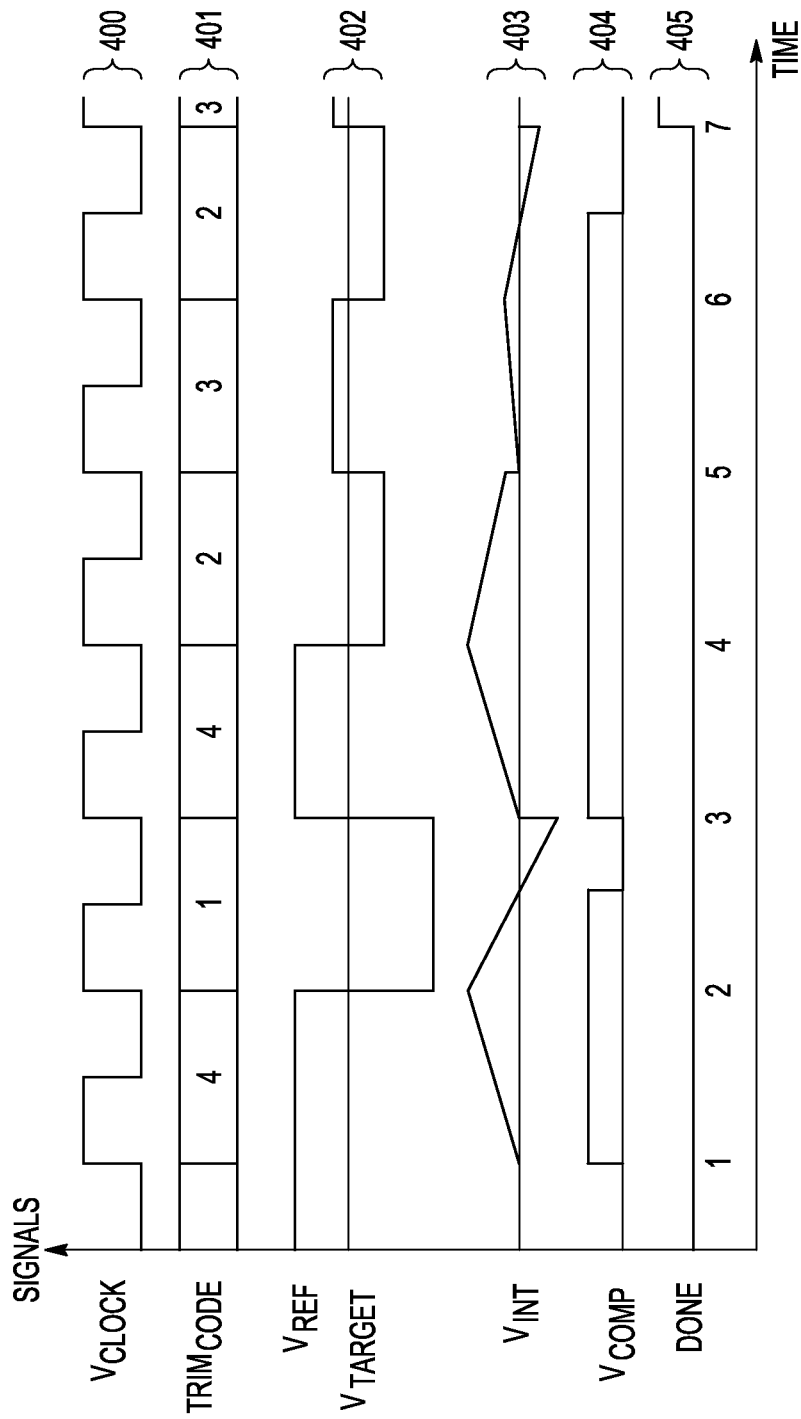
FIG. 4 is a graph illustrating an example of a production test trimming acceleration procedure according to some embodiments.

FIG. 4 is a graph of an example of a production test trimming acceleration procedure according to some embodiments. For sake of illustration, signals $V_{Clock}$ (400), $TRIM_{Code}$ (401), $V_{Ref}$ (402), $V_{Diff}=(V_{Ref}-V_{Target})$ (403), $V_{comp}$ (404) are shown for a number of integration periods, each period being equal to two clock cycles 400. "Done" signal 405 indicates the end of method 300 for a given slope, which occurs when the upper level trim code is equal to the lower level trim code.

Initially integrator 204 is reset (e.g., time=0). From that point on, integrator 204 integrates the error voltage $V_{Diff}$. An integration cycle includes of two parts: in the first part an upper trim code is applied to voltage reference circuit 202 while the respective error voltage is integrated ($V_{Int}$ increasing). Then, a lower trim code is applied. The voltage being integrated is now negative ($V_{Int}$ decreasing). At the end of the integration cycle, the output of integrator 204 is compared; it has either a positive or a negative value). If positive, the upper trim code is considered the furthest. If negative, the minimum trim code is considered furthest. And therefore the furthest trim code is updated for the next integration cycle. Before the next cycle, integrator 204 is again reset.

In this example, the first integration cycle takes place between times 1 and 3. In the first part of the first integration cycle, an upper trim code ("4") is applied and, in the second part of the same integration cycle, a lower trim code ("1") is applied. Because the result of the comparison between the first and second integrated values (403) is negative during the time period, the lower trim value is increased to "2" and the upper trim value is maintained as "4."

After integrator 204 is reset, a second integration cycle takes place between times 3 and 5. In the first part of the second integration cycle, the previous upper trim code ("4") is applied and, in the second part of the second integration cycle, the updated lower trim code ("2") is applied. This time, the result of the comparison between the first and second integrated values (403) is positive; therefore the upper trim value is reduced to "3" and the lower trim value is maintained at "2".

Again, after integrator 204 is reset, a third integration cycle takes place between times 5 and 7. In the first part of the third integration cycle, the updated upper trim code ("3") is applied and, in the second part of the third integration cycle, the updated lower trim code ("2") is applied. This time, the result of the comparison between the first and second integrated values (403) is again negative; therefore the lower trim value is increased to "3" and the upper trim value is maintained at "3". At this point, because the upper trim value is the same as the lower trim value, "done" signal indicates that the level trim code has been found for the given slope.

More generally, the foregoing processes may continue until the upper and lower trim-codes converge to an intermediate value that is optimum or suitable. In some cases, an extra clock cycle may be added before each integration cycle to reset integrator 204 and auto-zero the offset of comparator 205. An amplifier within integrator 204 may have its input stage flipped between the first and the second part of the integration cycle to cancel certain offset contributions. After a predetermined number of integration cycles, the integration period may be doubled, for example, periodically (e.g., at every cycle) to promote high noise immunity.

Bandgap voltage references may include a level and slope (voltage dependency to temperature) trims. The aforementioned procedures may be repeated for every slope trim-code to find the respective suitable or optimum level trim-codes; which may result in a number of trim-code combinations (slope/level) that are acquired at a first temperature test insertion and stored, for example, in a non-volatile (e.g., flash) memory or the like. Then, at a second temperature test insertion, those same combinations may be re-applied and the optimum combination may be selected as the bandgap final trim.

In some cases, the foregoing systems and methods may result in a voltage reference having a 6-sigma deviation smaller than 0.5% over process, voltage, and temperature (PVT) variations. Also, trimming times may be in the order of 8 ms, which represents an approximately 15× improvement over conventional, brute force methods. The total time taken to select 1 out of 32 trim combinations, for example, may be only 235 µs (compared to 10-20 ms for the conventional approach). Circuit 200 may occupy an area smaller than 0.01 mm$^2$, and may be placed under routing busses and made inactive after production test. As a person of ordinary skill in the art will recognize in light of this disclosure, however method 300 may be modified to trade speed for accuracy and/or noise immunity, and the foregoing numbers represent but only an example.

In an illustrative, non-limiting embodiment, a method may include providing a first trim code to a reference circuit, where the reference circuit is configured to output a first signal in response to the first trim code; integrating a difference between the first signal and a target voltage value into a first integrated value; providing a second trim code to the reference circuit, where the reference circuit is configured to output a second signal in response to the second trim code; integrating a difference between the second signal and the target voltage value into a second integrated value; and adjusting at least one of the first or second trim codes in response to a comparison between the first and second integrated values. For example, the reference circuit may be a bandgap voltage reference circuit and the first and second signals may be bandgap voltages.

In some implementations, the first trim code may be an upper level trim code, and the first signal may be a maximum voltage output. Adjusting the at least one of the first or second trim codes in response to the comparison may include, in response to the first integrated value being greater than the second integrated value, adjusting the upper trim code to cause the reference circuit to output a voltage smaller than the maximum voltage output. The method may further include repeating at least one of the providing, integrating, or adjusting operations until the comparison determines that the difference between the first and second integrated values is below a selected threshold.

In other implementations, the second trim code may be a lower level trim code, and the second signal may be a minimum voltage output. Adjusting the at least one of the first or second trim codes in response to the comparison may include, in response to the second integrated value being greater than the first integrated value, adjusting the lower trim code to cause the reference circuit to output a voltage greater than the minimum voltage output. The method may further include repeating at least one of the providing, integrating, or adjusting operations until the comparison determines that the difference between the first and second integrated values is below a selected threshold.

In another illustrative, non-limiting embodiment, an integrated circuit may include a control circuit configured to provide trim codes to a bandgap voltage reference circuit; a summer circuit configured to receive a target voltage and an output of the bandgap voltage reference circuit; an integrator circuit configured to receive a reset signal from the control circuit and an output from the summer circuit; and a comparator circuit configured to receive an output of the integrator circuit and to provide an output to the control circuit.

For example, the control circuit may be configured to provide a first trim code to the bandgap voltage reference circuit, and the bandgap voltage reference circuit may be configured to output a first bandgap reference voltage in response to the first trim code. The integrator circuit may be configured to integrate a difference between the first bandgap reference voltage and a target voltage value into a first integrated value, and to provide the first integrated value to the comparator circuit.

Additionally or alternatively, the control circuit may be configured to provide a second trim code to the bandgap voltage reference circuit subsequently to having provided the first trim code, and the bandgap voltage reference circuit may be configured to output a second bandgap reference voltage in response to the second trim code. The integrator circuit may be configured to integrate a difference between the second bandgap reference voltage and the target voltage value into the second integrated value.

Additionally or alternatively, the control circuit may be configured to adjust the first trim code to cause the voltage reference circuit to output a voltage smaller than the first bandgap reference voltage in response to the first integrated value being greater than the second integrated value. The control circuit may be further configured to adjust the second trim code to cause the voltage reference circuit to output a voltage greater than the second bandgap reference voltage in response to the second integrated value being greater than the first integrated value.

In yet another illustrative, non-limiting embodiment, a memory may have program instructions stored thereon that, upon execution by a logic circuit, cause the logic circuit to: provide an upper trim code to a bandgap voltage reference circuit, where the bandgap voltage reference circuit is configured to output a first bandgap reference voltage in response to the upper trim code; integrate a difference between the first bandgap reference voltage and a target voltage value into a first integrated value; provide a lower trim code to the bandgap voltage reference circuit, where the bandgap voltage reference circuit is configured to output a second bandgap reference voltage in response to the lower trim code; and integrate a difference between the second bandgap reference voltage and the target voltage value into a second integrated value.

The program instructions, upon execution by the logic circuit, may cause the logic circuit to adjust at least one of the upper or lower trim codes in response to a comparison between the first and second integrated values. The program instructions, upon execution by the logic circuit, may also cause the logic circuit to, in response to a determination that the first integrated value is greater than the second integrated value, adjust the upper trim code to cause the bandgap voltage reference circuit to output a voltage smaller than the first bandgap reference voltage. The program instructions, upon execution by the logic circuit, may further cause the logic circuit to repeat at least one of the providing, integrating, or adjusting operations until the difference between the first and second integrated values is below a selected threshold.

Additionally or alternatively, the program instructions, upon execution by the logic circuit, may cause the logic circuit to, in response to a determination that the second integrated value is greater than the first integrated value, adjust the lower trim code to cause the bandgap voltage reference circuit to output a voltage greater than the second bandgap reference voltage. The program instructions, upon execution by the logic circuit, may also cause the logic circuit to repeat at least one of the providing, integrating, or adjusting operations until the difference between the first and second integrated values is below a selected threshold.

Although the invention(s) is/are described herein with reference to specific embodiments, various modifications and changes can be made without departing from the scope of the present invention(s), as set forth in the claims below. For example, although presented in the context of bandgap circuits, various systems and methods described herein may be implemented in other types of voltage reference circuits, or other types of circuits. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method, comprising:
providing a first trim code to a reference circuit, wherein the reference circuit is configured to output a first signal in response to the first trim code;
integrating a difference between the first signal and a target voltage value into a first integrated value;
providing a second trim code to the reference circuit, wherein the reference circuit is configured to output a second signal in response to the second trim code;
integrating a difference between the second signal and the target voltage value into a second integrated value; and
adjusting at least one of the first or second trim codes in response to a comparison between the first and second integrated values.

2. The method of claim 1, wherein the reference circuit is a bandgap voltage reference circuit, and wherein the first and second signals are bandgap voltages.

3. The method of claim 1, wherein the first trim code is an upper level trim code, and wherein the first signal is a maximum voltage output.

4. The method of claim 3, wherein adjusting the at least one of the first or second trim codes in response to the comparison further comprises, in response to the first integrated value being greater than the second integrated value, adjusting the upper trim code to cause the reference circuit to output a voltage smaller than the maximum voltage output.

5. The method of claim 4, further comprising repeating at least one of the providing, integrating, or adjusting operations until the comparison determines that the difference between the first and second integrated values is below a selected threshold.

6. The method of claim 3, wherein the second trim code is a lower level trim code, and wherein the second signal is a minimum voltage output.

7. The method of claim 6, wherein adjusting the at least one of the first or second trim codes in response to the comparison further comprises, in response to the second integrated value being greater than the first integrated value, adjusting the lower trim code to cause the reference circuit to output a voltage greater than the minimum voltage output.

8. The method of claim 7, further comprising repeating at least one of the providing, integrating, or adjusting operations until the comparison determines that the difference between the first and second integrated values is below a selected threshold.

9. An integrated circuit, comprising:
a control circuit configured to provide trim codes to a bandgap voltage reference circuit;
a summer circuit configured to receive a target voltage and an output of the bandgap voltage reference circuit;
an integrator circuit configured to receive a reset signal from the control circuit and an output from the summer circuit; and
a comparator circuit configured to receive an output of the integrator circuit and to provide an output to the control circuit.

10. The integrated circuit of claim 9, wherein the control circuit is configured to provide a first trim code to the bandgap voltage reference circuit, and wherein the bandgap voltage reference circuit is configured to output a first bandgap reference voltage in response to the first trim code.

11. The integrated circuit of claim 10, wherein the integrator circuit is configured to integrate a difference between the first bandgap reference voltage and a target voltage value into a first integrated value, and to provide the first integrated value to the comparator circuit.

12. The integrated circuit of claim 11, wherein the control circuit is configured to provide a second trim code to the bandgap voltage reference circuit subsequently to having provided the first trim code, and wherein the bandgap voltage reference circuit is configured to output a second bandgap reference voltage in response to the second trim code.

13. The integrated circuit of claim 12, wherein the integrator circuit is configured to integrate a difference between the second bandgap reference voltage and the target voltage value into the second integrated value.

14. The integrated circuit of claim 13, wherein the control circuit is configured to adjust the first trim code to cause the voltage reference circuit to output a voltage smaller than the first bandgap reference voltage in response to the first integrated value being greater than the second integrated value.

15. The integrated circuit of claim 13, wherein the control circuit is configured to adjust the second trim code to cause the voltage reference circuit to output a voltage greater than the second bandgap reference voltage in response to the second integrated value being greater than the first integrated value.

16. A memory having program instructions stored thereon that, upon execution by a logic circuit, cause the logic circuit to:
provide an upper trim code to a bandgap voltage reference circuit, wherein the bandgap voltage reference circuit is configured to output a first bandgap reference voltage in response to the upper trim code;
integrate a difference between the first bandgap reference voltage and a target voltage value into a first integrated value;
provide a lower trim code to the bandgap voltage reference circuit, wherein the bandgap voltage reference circuit is configured to output a second bandgap reference voltage in response to the lower trim code; and
integrate a difference between the second bandgap reference voltage and the target voltage value into a second integrated value.

17. The memory of claim 15, wherein the program instructions, upon execution by the logic circuit, further cause the logic circuit to adjust at least one of the upper or lower trim codes in response to a comparison between the first and second integrated values.

18. The memory of claim 15, wherein the program instructions, upon execution by the logic circuit, further cause the logic circuit to, in response to a determination that the first integrated value is greater than the second integrated value, adjust the upper trim code to cause the bandgap voltage reference circuit to output a voltage smaller than the first bandgap reference voltage.

19. The memory of claim 16, wherein the program instructions, upon execution by the logic circuit, further cause the logic circuit to repeat at least one of the providing, integrating, or adjusting operations until the difference between the first and second integrated values is below a selected threshold.

20. The memory of claim 15, wherein the program instructions, upon execution by the logic circuit, further cause the logic circuit to, in response to a determination that the second integrated value is greater than the first integrated value, adjust the lower trim code to cause the bandgap voltage reference circuit to output a voltage greater than the second bandgap reference voltage.

21. The memory of claim 19, wherein the program instructions, upon execution by the logic circuit, further cause the logic circuit to repeat at least one of the providing, integrating, or adjusting operations until the difference between the first and second integrated values is below a selected threshold.

* * * * *